US007598184B2

(12) United States Patent
Shamiryan et al.

(10) Patent No.: US 7,598,184 B2
(45) Date of Patent: Oct. 6, 2009

(54) PLASMA COMPOSITION FOR SELECTIVE HIGH-K ETCH

(75) Inventors: Denis Shamiryan, Leuven (BE); Vasile Paraschiv, Kessel-lo (BE); Marc Demand, Jandrain-Jandrenouille (BE)

(73) Assignee: IMEC, Leuven (BE)

( * ) Notice: Subject to any disclaimer, the term of this patent is extended or adjusted under 35 U.S.C. 154(b) by 458 days.

(21) Appl. No.: 11/585,564

(22) Filed: Oct. 24, 2006

(65) Prior Publication Data

US 2007/0099403 A1 May 3, 2007

Related U.S. Application Data

(60) Provisional application No. 60/839,897, filed on Aug. 23, 2006, provisional application No. 60/731,608, filed on Oct. 28, 2005.

(51) Int. Cl.
*H01L 21/469* (2006.01)
(52) U.S. Cl. .................. 438/788; 438/773; 438/792; 257/E21.143; 257/E21.212; 257/E21.218
(58) Field of Classification Search .......... 438/689, 438/758, 52, 700, 773, 788, 792, 637
See application file for complete search history.

(56) References Cited

U.S. PATENT DOCUMENTS 3,878,084 A   4/1975   Schultz et al.
5,314,576 A   5/1994   Kadomura (Continued)

FOREIGN PATENT DOCUMENTS

EP   1137058 A1   9/2001

(Continued)

OTHER PUBLICATIONS

Office Action mailed Aug. 24, 2007 in related application U.S. Appl. No. 11/544,351.

(Continued)

*Primary Examiner*—Matthew Smith
*Assistant Examiner*—Wilner Jean Baptiste
(74) *Attorney, Agent, or Firm*—Knobbe Martens Olson & Bear LLP

(57) ABSTRACT

A method for the selective removal of a high-k layer such as $HfO_2$ over silicon or silicon dioxide is provided. More specifically, a method for etching high-k selectively over silicon and silicon dioxide and a plasma composition for performing the selective etch process is provided. Using a $BCl_3$ plasma with well defined concentrations of nitrogen makes it possible to etch high-k with at a reasonable etch rate while silicon and silicon dioxide have an etch rate of almost zero. The $BCl_3$ comprising plasmas have preferred additions of 10 up to 13% nitrogen. Adding a well defined concentration of nitrogen to the $BCl_3/N_2$ plasma gives the unexpected deposition of a Boron-Nitrogen (BxNy) comprising film onto the silicon and silicon dioxide which is not deposited onto the high-k material. Due to the deposition of the Boron-Nitrogen (BxNy) comprising film, the etch rate of silicon and silicon dioxide is dropped down to zero. The Boron-Nitrogen (BxNy) comprising film can be removed during the etching process using the right substrate bias (leading to ion bombardment) or after the etching process by a simple water rinse since the Boron-Nitrogen (BxNy) comprising film is water soluble.

18 Claims, 4 Drawing Sheets

U.S. PATENT DOCUMENTS

| | | |
|---|---|---|
| 6,350,665 B1 | 2/2002 | Jin et al. |
| 6,399,508 B1 | 6/2002 | Ting et al. |
| 6,436,838 B1 | 8/2002 | Ying et al. |
| 6,440,865 B1 | 8/2002 | Lee |
| 6,770,506 B2 * | 8/2004 | Gogoi .................. 438/52 |
| 7,119,032 B2 * | 10/2006 | Ji et al. ................ 438/758 |
| 2002/0079057 A1 | 6/2002 | Yoshioka et al. |
| 2003/0036264 A1 * | 2/2003 | Ying et al. ............ 438/689 |
| 2003/0160247 A1 * | 8/2003 | Miyazawa ............. 257/79 |

FOREIGN PATENT DOCUMENTS

| | | |
|---|---|---|
| EP | 1333471 A2 | 8/2003 |

OTHER PUBLICATIONS

Claes et al., "Selective Wet Etching of Hf-Based Layers," Abstract 549, 204th Meet. of Electrochem. Soc., 2003.

U.S. Appl. No. 11/544,351, filed Oct. 5, 2006, available as Image File Wrapper.

Marx et al. "Electron cyclotron resonance etching of aluminum alloys with $BCL_3$-$Cl_2$-$N_2$" J. Vac. Sci. Technol. A 10(4), Jul./Aug. 1992, 1232-1237.

Howard et al. "Reactive ion etching of copper with $BCl_3$ and $SiCl_4$: Plasma diagnostics and patterning" J. Vac. Sci. Technol. A 12(4), Jul./Aug. 1994, 1259-1264.

* cited by examiner

PLASMA COMPOSITION FOR SELECTIVE HIGH-K ETCH

CROSS-REFERENCE TO RELATED APPLICATIONS

This application claims the benefit under 35 U.S.C. § 119 (e) of U.S. provisional application Ser. No. 60/731,608, filed Oct. 28, 2005, and U.S. provisional application Ser. No. 60/839,897, filed Aug. 23, 2006, and claims the benefit under 35 U.S.C. § 119(a)-(d) of European application No. 06121143.9, filed Sep. 22, 2006, the disclosures of which are hereby expressly incorporated by reference in their entirety and are hereby expressly made a portion of this application.

FIELD OF THE INVENTION

The preferred embodiments are related to the field of semiconductor processing. More specifically they are related to the patterning of a high-k layer selective over a silicon comprising layer. The preferred embodiments are further related to an etch plasma composition and its use for dry etching of a high-k layer selective over a silicon comprising layer such as polycrystalline silicon and $SiO_2$.

BACKGROUND OF THE INVENTION

As the critical dimensions in CMOS manufacturing shrink for the 90 nm technology node and beyond, conventional (polycrystalline) silicon gates are being replaced by metal gates (meaning pure metals, metal alloys or metal nitrides, etc) and $SiO_2$ as a gate dielectric is replaced by materials with higher dielectric constant (so called "high-k" dielectrics). The key challenge is to adapt the conventional gate etch processes to these new materials.

Following deposition and gate patterning, the high-k dielectric material is removed from the source and drain regions of the transistor. This removal is accomplished without the loss of any of the underlying silicon, as well as little or no isolation oxide (field oxide) loss. To date, the most promising dry etch results show an $HfO_2$ to silicon ($HfO_2$/Si), as well as an $HfO_2$ to $SiO_2$ ($HfO_2$/$SiO_2$) etch selectivity no greater than three. Dilute aqueous hydrofluoric acid (HF) solutions will etch $HfO_2$ but unfortunately, the etch selectivity of $HfO_2$ over thermally grown silicon dioxide (TOX) is ~1:10, and the etch selectivity of $HfO_2$ over tetraethylorthosilicate-based silicon dioxide (TEOS) is ~1:100 for dilute aqueous HF etchants. Replacing water with a non-aqueous solvent, such as an alcohol, will improve etch selectivity. An $HfO_2$ to TOX etch selectivity of 3:1 and an $HfO_2$ to TEOS etch selectivity of 1:1 has been reported (Claes et al., "Selective Wet Etching of Hf-Based Layers," Abstract 549, 204th Meet. of Electrochem. Soc., 2003).

SUMMARY OF THE INVENTION

It can therefore be concluded that there is still a need to improve the etch selectivity of high-k materials such as $HfO_2$ over silicon and silicon dioxide.

Improving the etch selectivity of dry-etch plasmas used to pattern high-k materials containing metal-oxides, such as $HfO_2$ over silicon and silicon dioxide materials, is desirable.

The preferred embodiments relate to a plasma composition used to pattern a high-k comprising stack towards a silicon or silicon dioxide comprising stack with increased selectivity. The silicon comprising stack can be a polycrystalline Si layer or a doped polycrystalline Si layer.

Furthermore the preferred embodiments relate to a method for the patterning of a high-k comprising stack. More specifically they relate to the dry etching of high-k layers selectively over silicon and silicon dioxide. The high-k layer is preferably a metal-oxide layer. A preferred example of the high-k layer is an Hf comprising layer such as an $HfO_2$ layer but other high-k layers are also provided.

The preferred embodiments solve the problem of the low etch selectivity of high-k materials towards silicon and silicon-dioxide. Examples of high-k layers provided are $HfO_2$, $ZrO_2$, $Al_2O_3$, $La_2O_3$, $Pr_2O_3$, $Ta_2O_5$, and the like. The high-k material is preferably a metal-oxide and most preferred the high-k material is $HfO_2$. The plasmas used in prior art to pattern high-k layers typically have an etch selectivity of 1:3 over silicon and silicon dioxide. Using the method of the preferred embodiments makes it possible to reach an etch selectivity of high-k materials such as $HfO_2$ over silicon and/or silicon dioxide up to 1:20.

The improvement in etch selectivity is based on the surprising effect that using a boron halogen plasma such as a $BCl_3$ plasma with well defined additions of nitrogen leads to the formation and deposition of a $B_xN_y$ film onto the silicon surface which reduces the etch rate of the silicon material. The $B_xN_y$ film is deposited onto the silicon and/or silicon dioxide and not on the high-k material (e.g. $HfO_2$).

More specifically a boron-halogen comprising plasma with additions of nitrogen for selective etching of at least two materials is provided whereby the etch rate of the first material is reduced to almost zero by depositing a protective $B_xN_y$ comprising layer onto the surface of the first material such that the etch rate of the first material drops down to zero and whereby deposition of the $B_xN_y$ layer onto the second material is avoided.

The preferred boron-halogen compound used in the preferred embodiments is $BCl_3$. The preferred addition of nitrogen to the $BCl_3$ plasma is lower than 15% of the total plasma composition.

In a preferred embodiment, the first material is silicon and the second material is a high-k material. The preferred addition of nitrogen is lower than 15% and more preferred above 5% and most preferred the addition of nitrogen is 10% of the total plasma composition. More preferred, the first material is undoped polycrystalline silicon (poly-Si) or doped or polycrystalline silicon (poly-Si). More preferred the second material is $HfO_2$. Preferably the first and second materials are part of a gate stack in a semiconductor device. Alternatively the first and second material are part of a Non-Volatile Memory (NVM) device.

In another preferred embodiment, the first material is silicon dioxide and the second material is a high-k material. The preferred addition of nitrogen is lower than 15% and more preferred above 10% and most preferred in the range of 10% up to 13% of the total plasma composition. More preferred the second material is $HfO_2$ Preferably the first and second materials are part of a gate stack in a semiconductor device. Alternatively the first and second material are part of a Non-Volatile Memory (NVM) device. In preferred embodiments, the plasma composition further comprises an inert compound. The addition of an inert compound (meaning that these compounds do not react with the substrate to be etched such that volatile compounds are formed) can improve the dissociation rate in the plasma and improve the formation (deposition) of a $B_xN_y$ film. In that case the inert compound can be seen as a catalyst.

When the plasma comprises beside $BCl_3$ and nitrogen, other compounds such as inert compounds, particular ratios of $BCl_3$ towards nitrogen are preferred.

When the first material is silicon dioxide and the second material is a high-k material (e.g. $HfO_2$), the preferred ratio of nitrogen towards $BCl_3$ is lower than 1:5.6 and more preferred above 1:9 and most preferred in the range of 1:9 up to 1:6.7.

When the first material is silicon and the second material is a high-k material (e.g. $HfO_2$), the preferred ratio of nitrogen towards $BCl_3$ is lower than 1:5.6 and more preferred above 1:19 and most preferred the ratio of nitrogen towards $BCl_3$ is 1:9.

In the preferred embodiments, the protective BxNy layer can be removed during etching (using the plasma composition) by means of ion bombardment. More preferred the ion bombardment is achieved by using a substrate bias during plasma etching which is different from zero. Most preferred the substrate bias during plasma etching is in the range of −30 v and −60V.

In preferred embodiments, the protective BxNy layer can be (alternatively) removed after etching by means of a wet rinse (e.g. by means of a water rinse).

In yet another preferred embodiment, the protective BxNy layer is removed by a combination of a first removal step during etching by means of ion bombardment using a substrate bias different from zero and a second removal step preformed after etching by means of a wet rinse (e.g. by means of a water rinse).

Preferably, the power in the etch chamber is from about 100 W up to about 1200 W. More preferred the power in the etch chamber is about 450 W. Preferably, the plasma (during patterning) has a pressure in the plasma chamber of minimum 0.666 Pa (5 mT) and maximum 10.665 Pa (80 mT). More preferred the pressure is 0.666 Pa (5 mT).

Preferably, the plasma (during patterning) has a temperature below 100° C. and most preferred the plasma temperature during dry-etch patterning is around 60° C.

Furthermore, a method is provided for etching a second material selective over a first material, the method comprising the steps of first applying a dry-etch step using a plasma whereby during the etching a protective and water-soluble film is deposited onto the first material such that the etch rate of the first material is dropped to almost zero and whereby almost no protective and water-soluble film is deposited onto the second material. Subsequently, the protective film is removed from the first material.

The preferred embodiments also relate to the use of a plasma comprising (or consisting of) $BCl_3$, to which nitrogen is added to reach 10% to 15% of the total volume of the resulting plasma composition, for selectively etching a (suitable) stack of layer (i.e. comprising at least one layer etchable by the $BCl_3$ component) selectively over a silicon or silicon-dioxide layer. More preferred the addition of nitrogen is above about 10% and most preferred of from about 10% up to about 13% of the total plasma composition.

The methods of preferred embodiments are particularly useful for (patterning) a stack of layers in a device wherein at least one layer is a high-k layer which is etched selectively over a silicon or silicon dioxide layer. Most preferred the high-k layer is a metal oxide such as $HfO_2$. Most preferred the device is a semiconductor device in which a gate stack is patterned. Alternatively and also preferred the device is a Non Volatile Memory device.

BRIEF DESCRIPTION OF THE DRAWINGS

All drawings are intended to illustrate some aspects and embodiments of the present invention. Not all alternatives and options are shown and therefore the invention is not limited to the content of the given drawings.

DETAILED DESCRIPTION OF THE PREFERRED EMBODIMENT

Figure 1:
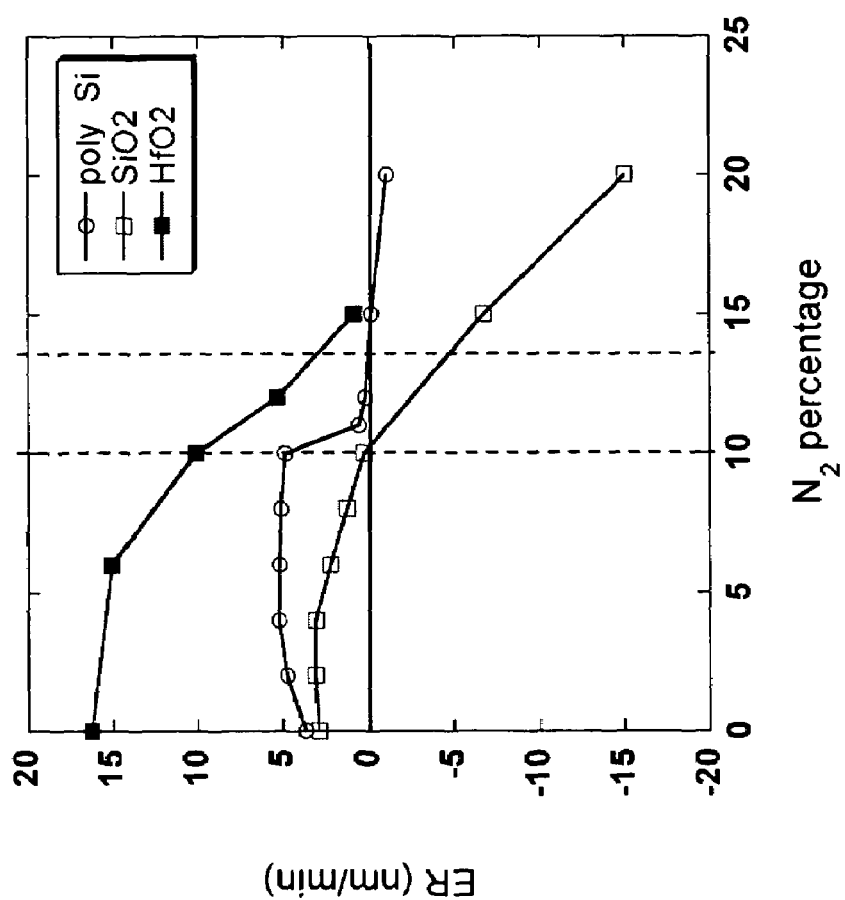
FIG. 1 illustrates the etch rate of $HfO_2$, $SiO_2$ and polysilicon (poly Si) using a $BCl_3$ plasma with increasing additions of nitrogen. One can see that at a certain concentration of nitrogen the etch rate of poly silicon and $SiO_2$ becomes negative and a BxNy film starts to be deposited quicker than removed. The optimum concentration of nitrogen added to the total plasma composition (in this case pure $BCl_3/N_2$ plasma) is indicated in the graph.

In relation to the drawings the preferred embodiments are described very briefly and general in the sequel. It is apparent, however, that a person skilled in the art knows how to perform the etch process in detail and compose an etch recipe.

In the context of the preferred embodiments, the "term poly-Si" as used herein is a broad term, and is to be given its ordinary and customary meaning to a person of ordinary skill in the art (and is not to be limited to a special or customized meaning), and refers without limitation to Polycrystalline Silicon, which is a form of silicon composed of many crystals and is widely used as gate electrode in a semiconductor device. The poly-Si can be further doped to increase its performance.

In the context of the preferred embodiments, the term "substrate bias" as used herein is a broad term, and is to be given its ordinary and customary meaning to a person of ordinary skill in the art (and is not to be limited to a special or customized meaning), and refers without limitation to the voltage applied to the substrate in a Reactive Ion Etching (RIE) chamber. This value is expressed in Volt (as a negative number). The absence of substrate bias (Bias=0) gives substantially no ion bombardment meaning almost no etching behavior.

In the context of the preferred embodiments, the terms "sacrificial layer", "protective layer" and "passivation layer" as used herein are broad terms, and are to be given their ordinary and customary meaning to a person of ordinary skill in the art (and are not to be limited to a special or customized meaning), and refer without limitation to the BxNx like film which is deposited during etching using a $BCl_3/N_2$ comprising plasma having well defined amounts of nitrogen. The BxNy film is used as a "protective" or "passivating" film during patterning/etching of a structure, the BxNy film is also referred to as a sacrificial layer because the layer is preferably removed during (simultaneously) or after etching. During etching the BxNy film can be removed (completely or partly) by tuning the substrate bias leading towards sufficient ion bombardment to remove the BxNy film. After etching the BxNy film can be removed by a water rinse due to the unstable and water-soluble character of the BxNy film.

In the context of the preferred embodiments, the term "selectivity" as used herein is a broad term, and is to be given its ordinary and customary meaning to a person of ordinary skill in the art (and is not to be limited to a special or customized meaning), and refers without limitation to the etch rate of a selected material towards another material. The material to be etched away preferably has a much higher etch rate than the other materials.

In the context of the preferred embodiments, the term "ratio" as used herein is a broad term, and is to be given its ordinary and customary meaning to a person of ordinary skill in the art (and is not to be limited to a special or customized meaning), and refers without limitation to an amount of a first compound to a second compound, e.g. a ratio of 9:1 means e.g. 9 sccm (standard centimeter cube per minute) of the first compound and 1 sccm of the second compound.

In the context of the preferred embodiments, the term "anisotropic etch" as used herein is a broad term, and is to be given its ordinary and customary meaning to a person of ordinary skill in the art (and is not to be limited to a special or customized meaning), and refers without limitation to the etch in which etch rate in the direction perpendicular to the surface (or substrate) is much higher than in direction parallel to the surface (or substrate). This in contrast to "isotropic etch" which as used herein is a broad term, and is to be given its ordinary and customary meaning to a person of ordinary skill in the art (and is not to be limited to a special or customized meaning), and refers without limitation to etching that occurs the same in any direction or being non-directional.

In the context of the preferred embodiments, the term "high-k material" as used herein is a broad term, and is to be given its ordinary and customary meaning to a person of ordinary skill in the art (and is not to be limited to a special or customized meaning), and refers without limitation to a dielectric material with a dielectric constant greater than the dielectric constant of silicon dioxide, k>4. As minimum feature sizes have shrunk it has been necessary to shrink the thickness of the gate oxides in proportion. Preferred examples of the high-k materials are $HfO_2$, $ZrO_2$, $Ta_2O_5$, $TiO_2$, $Ta_2O_5$, $Y_2O_3$, $La_2O_3$, $Pr_2O_3$, and the like. In the context of the preferred embodiments, "integrated circuit" and "semiconductor devices" as used herein are broad terms, and are to be given their ordinary and customary meaning to a person of ordinary skill in the art (and are not to be limited to a special or customized meaning), and refer without limitation to devices formed on semiconducting substrates, such as group IV materials like silicon or group III-V compounds like gallium arsenide, or structured substrate such as silicon-on-insulator, strained silicon and silicon-germanium, or mixtures of such materials. The terms include all types of devices formed, such as memory and logic, and all designs of such devices, such as MOS and bipolar. The term also encompasses applications such as flat panel displays, solar cells, and charge coupled devices.

A plasma composition for selective anisotropic dry-etching of at least two materials is provided whereby the etch rate of the first material is reduced to almost zero by depositing a protective layer during etching onto the surface of the first material such that the etch rate of the first material drops down to zero and whereby deposition of the protective layer onto the second material is avoided.

More specifically, a composition of a plasma optimized to etch a high-k material with improved selectivity towards silicon and silicon dioxide materials is provided. The dry-etching method is an anisotropical dry-etching method and the high-k material is preferably a metal-oxide and most preferred the high-k material is $HfO_2$. The plasma used in prior art to pattern a high-k layer (e.g. $HfO_2$) is typically a (pure) $BCl_3$ plasma. The metal-oxide in question can be etched by the $BCl_3$ plasma (in contrary to a $Cl_2$ plasma) by formation of volatile $BOCl_x$ compounds thereby eliminating the need of a breakthrough step if the metal to be etched is a metal-oxide.

The metal in question (e.g. Hf) can be etched further by means of the $BCl_3$ plasma forming volatile halides (e.g. $HfCl_4$). The $BCl_3$ plasma typically has an etch selectivity of 1:3 for $HfO_2$ over silicon and silicon dioxide.

The plasma of the preferred embodiments solves the problem of a too low etch selectivity by adding a well defined amount of nitrogen to the $BCl_3$ plasma. The etch rate of silicon and silicon dioxide is decreased due to the formation and deposition of $B_xN_y$ polymers onto the silicon and silicon dioxide surface and not onto the high-k layers (at least not in the same degree). The $B_xN_y$ film can be removed simultaneously during etching by ion bombardment which has as consequence a significant drop down in etch rate. The amount of nitrogen added to the plasma is preferably lower than 15% and more preferred in the range of 10% up to 13% nitrogen to the total plasma composition.

The plasma used to pattern high-k layers is preferably $BCl_3$. The improvement in etch selectivity (etch selectivity of the high-k layer over silicon or silicon dioxide) of the $BCl_3$ plasma is achieved by adding a well defined concentration of nitrogen to the $BCl_3$ plasma. The concentration of nitrogen is preferably lower than 15% nitrogen to the total plasma composition.

By adding nitrogen to the $BCl_3$ plasma, a boron-nitride comprising by-product is formed. The boron nitride compound is deposited on the silicon by forming a Si—B bonding since silicon itself is not forming a volatile compound with $BCl_3$. In case a silicon dioxide substrate is present, the oxide is first removed by the $BCl_3$ plasma through the formation of $BOCl_x$ such that the Si becomes available to form the Si—B bonding.

For silicon and silicon dioxide the improvement in etch selectivity is in the order of a factor 4 to 7 compared to the original etch selectivity.

When the high-k layer is $HfO_2$, and the silicon comprising layer is poly-Si, the concentration of nitrogen is preferably above 10% nitrogen. The most preferred concentration of nitrogen to the total plasma composition which also gives a reasonable etch rate for the $HfO_2$ layer is in the range of 10% up to 13% nitrogen to the total plasma composition.

When the high-k layer is $HfO_2$, and the silicon comprising layer is silicon dioxide, the concentration of nitrogen is preferably above about 5% and more preferred the concentration of nitrogen is about 10% of the total plasma composition.

The plasma can further comprise an inert compound but this is not necessary to achieve the effect of depositing the $B_xN_y$ film. The inert compound can be e.g. argon (Ar) or helium (He) and this compound can be added to the plasma in concentrations up to 50% of the total plasma composition. The addition of an inert compound (meaning that these compounds do not react with the substrate to be etched such that volatile compounds are formed) can improve the dissociation rate in the plasma and hence improve the etch rate and, more specifically in case of the preferred embodiments, improve the formation (deposition) of a $B_xN_y$ film. In that case the inert compound can be seen as a catalyst.

When the plasma comprises, beside $BCl_3$ and nitrogen, other compounds such as inert compounds, the ratio of $BCl_3$ towards nitrogen is selected to obtain a preferred ratio.

When the first material is silicon dioxide and the second material is a high-k material (e.g. $HfO_2$), the preferred ratio of nitrogen towards $BCl_3$ is lower than 1:5.6 and more preferred above 1:9 and most preferred in the range of 1:9 up to 1:6.7.

When the first material is silicon and the second material is a high-k material (e.g. $HfO_2$), the preferred ratio of nitrogen towards $BCl_3$ is lower than 1:5.6 and more preferred above 1:19 and most preferred the ratio of nitrogen towards $BCl_3$ is 1:9.

Application of a well defined $BCl_3/N_2$ comprising (or consisting) plasma results in the deposition of a BxNy-like film onto the silicon comprising substrate during the etching of the high-k material. The film can be destroyed using ion bombardment. The ion bombardment can be tuned in the plasma during high-k etch by tuning the substrate bias or in other words tuning the voltage applied to the substrate during etching. The substrate bias is typically expressed as a negative value and lowering the substrate bias will lead to a higher etch selectivity of high-k material over silicon comprising materials. The substrate bias is preferably different from zero and more preferred in the range of −30V and −60V.

Preferred embodiments utilize the surprising effect of the selective deposition of a BxNy film during the etching of a structure using a $BCl_3/N_2$ comprising plasma. The BxNy film deposit differently onto different kind of materials which makes it suitable to tune the etch rate of different materials relative to each other. The $BCl_3/N_2$ comprising plasma has well defined amount of nitrogen. The deposition of the BxNy film is performed in a plasma etch chamber (e.g. Versys 2300 etch chamber from LAM®) at low temperatures (e.g. 60° C.) that has never been reported before (BN deposition is usually performed at temperatures in the range 390° C.-650° C.). The BxNy film can deposited at a rate as high as e.g. 300 nm/min depending on the pressure, plasma power, gas flows and plasma composition (more specifically the $BCl_3$ to $N_2$ ratio). The deposited BxNy-like film was found to be easily decomposed by temperature (the film thickness decreases at temperatures above 100° C.) and is soluble in water at room temperatures. A method for the dry etching of non-silicon comprising layers such as high-k materials (e.g. $HfO_2$) selectively over Si comprising layers such as Si (e.g. poly-Si) and/or Silicon-dioxide is also provided. The preferred embodiments solve the problem of insufficient selectivity using a dry-etch plasma whereby a protective layer is deposited onto the silicon comprising layer(s) during dry-etching and whereby almost no deposition of the protective layer is obtained onto the non-silicon-containing layers such as a $HfO_2$ layer. Due to the deposition of a protective layer onto the silicon-comprising layer(s), the etch rate of the silicon-comprising layers is decreased. The protective layer is preferably a BxNy film which is deposited during etching as a by-product onto the silicon-comprising layer(s), the plasma used is preferably a $BCl_3/N_2$ comprising plasma whereby the amount of nitrogen added to the BCl3 is a well defined concentration such that the etch selectivity of the non-silicon-containing high-k layers over the silicon-comprising layer(s) is increased significantly. Depending on the further etch parameters such as substrate bias, the protective BxNy film can be removed simultaneously during etching.

A method is provided to pattern a high-k comprising stack of layers selectively over a silicon or silicon-dioxide layer (or substrate). The patterning is an anisotropic dry-etching. Most preferred the stack of layers are gate stack layers. The stack of layers is situated or deposited onto a substrate. Most preferred the substrate is a silicon (Si) comprising substrate. The patterning can be employed to pattern or to form a gate structure in the gate stack layers. The gate structure comprises at least one gate electrode (layer) and at least one gate oxide or high-k (layer) situated below the gate electrode layer. More specifically the preferred embodiments relate to the selective etching (or patterning) of the gate oxide layer (also referred to as high-k layer) towards the Si substrate.

The substrate bias is preferably selected to achieve a desired effect. Most preferred the substrate bias is such that there is still a reasonable etch rate achieved for the removal of high-k (the high-k material defined as a metal-oxide such as e.g. $HfO_2$) and such that the etch rate of a silicon (or Ge) comprising layer is reduced to a minimum (or almost zero) due to the simultaneous deposition of a BxNy film onto the Si (or Ge) comprising layer.

The substrate bias is preferably different from zero and more preferred in the range of −30V and −60V.

Most preferred, the removal of the BxNy film is achieved by ion bombardment (by tuning the substrate bias to the corresponding value). The ion bombardment (substrate bias value) is such that almost a complete removal of the BxNy film is achieved and almost no removal of the Si (or Ge) is seen.

An additional positive effect can be obtained when using the methods of the preferred embodiments. The additional effect takes place simultaneously when applying the method to improve the etch selectivity of a high-k layer. The effect is characterized as preserving existing vertical profiles and keeping the critical dimension of the vertical structure intact. As an example it can be illustrated in the case whereby above the high-k layer a vertical structure is already present and whereby the material of the structure is very sensitive to a $BCl_3$ plasma leading to damage and distortion of the vertical profile (e.g. lateral attack by the $BCl_3$ plasma used to etch the high-k layer). As an example the method can be used to etch a stack comprising e.g. a germanium (Ge) structure (vertical profile) on top of the high-k layer whereby lateral attack of the Ge profile due to the aggressive $BCl_3$ plasma is avoided. The addition of 10-15% nitrogen will preserve the vertical profile due the deposition of a protective BxNy layer which is deposited during etching. The protective BxNy layer can be easily removed after etching by means of water due to the water-soluble character of the BxNy layer.

Furthermore, the plasma can be used to preserve the vertical profile of already existing vertical structures through the formation of a passivating BxNy-like layer on the vertical surfaces.

Also provided is the use of a Cl-based plasma with small additions of nitrogen for the selective etch of high-k towards silicon and silicon dioxide.

EXAMPLES

Example 1

Application of $BCl_3/N_2$ Used to $HfO_2$ Selectively Over Si Substrate Underneath A $BCl_3/N_2$ plasma was used to pattern a gate structure having a high-k material (the high-k dielectric was $HfO_2$). The high-k dielectric was removed selectively to the underlying Si substrate. The gate stack further comprised Germanium on top of the high-k.

Using a $BCl_3/N_2$ plasma, the $HfO_2$ was removed selectively over the silicon. The amount of nitrogen in the $BCl_3/N_2$ plasma was 10% nitrogen to the total plasma concentration.

Figure 2:
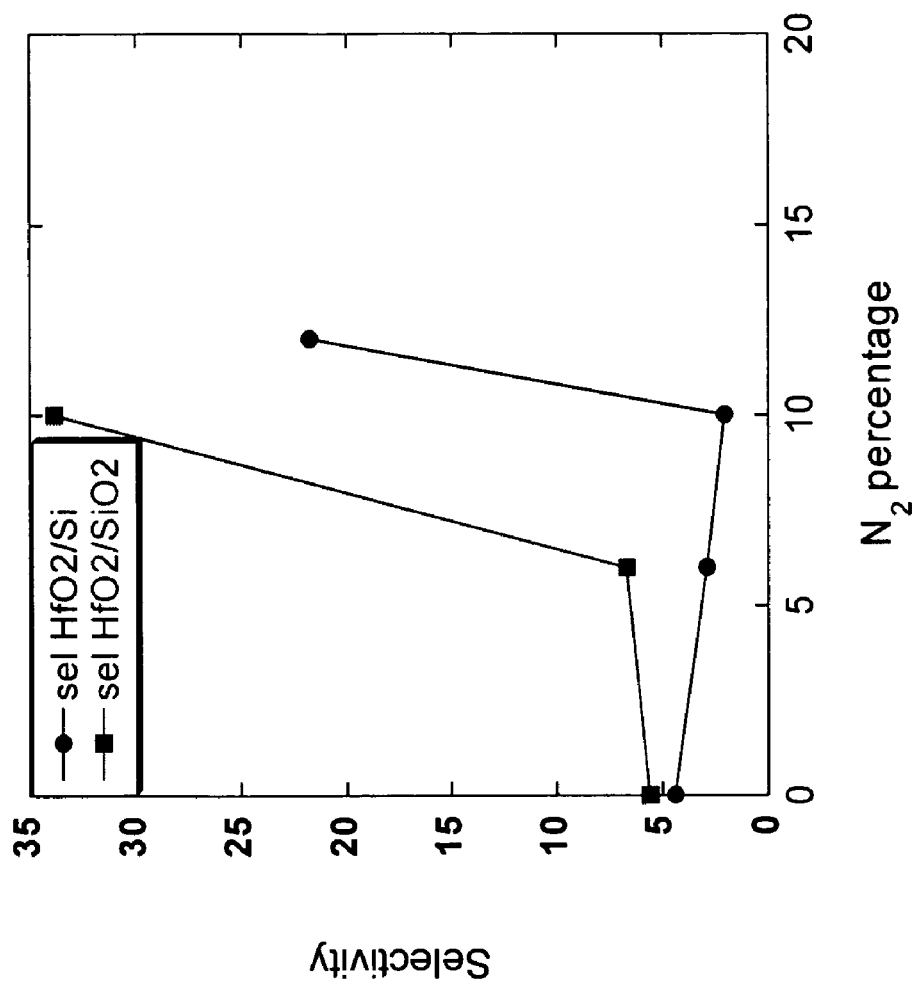
FIG. 2 shows the etch selectivity of $HfO_2$ towards silicon and the etch selectivity of $HfO_2$ towards $SiO_2$. The etch selectivity is expressed as the etch rate of $HfO_2$ divided by the etch rate of $SiO_2$ in a pure $BCl_3/N_2$ plasma.

An advantage of using the $BCl_3/N_2$ plasma is this example was the fact that Ge gate profile just after patterning and before high-k removal as shown in FIG. 2 was straight and no lateral attack due to the $BCl_3$ plasma was seen because a protective BxNy layer was deposited onto the sidewalls of the Ge structure during the removal of high-k.

Figures 3A, 3B:
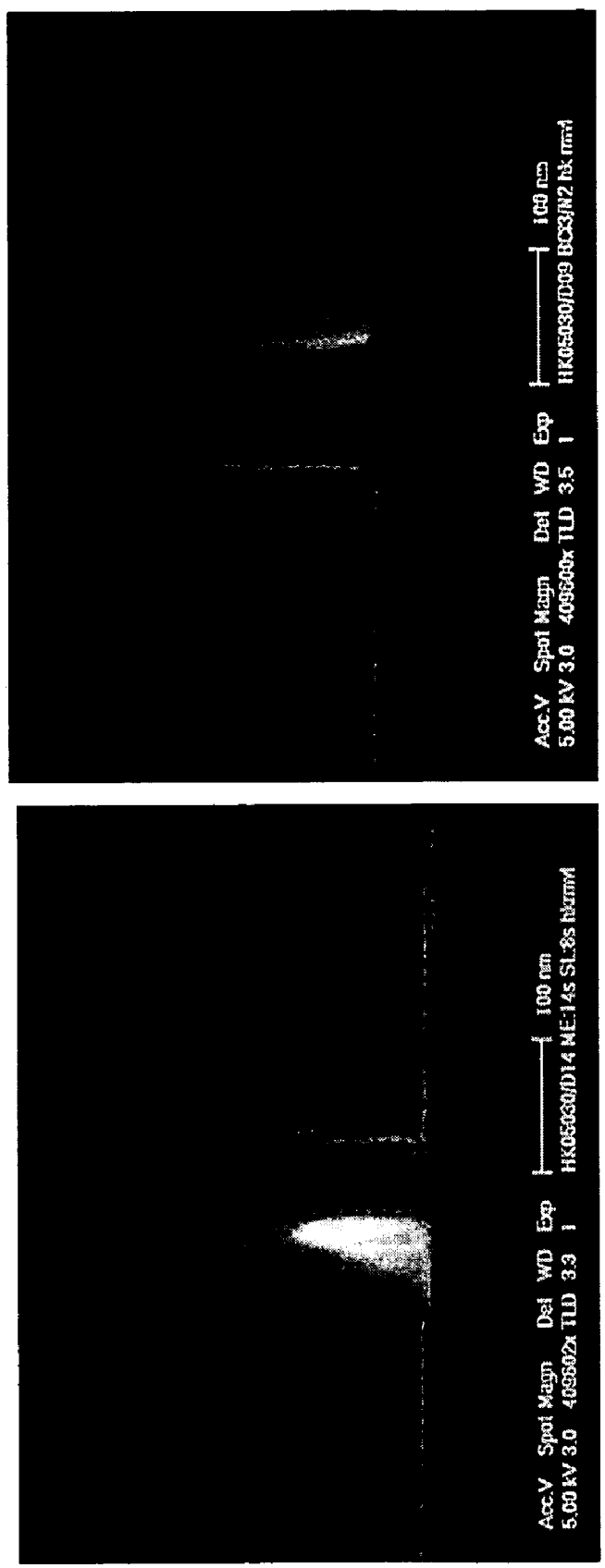
FIG. 3 shows a Ge gate profile after high-k removal by pure $BCl_3$ plasma for 10 seconds (FIG. 3A) and $BCl_3/N_2$ (10% N2) plasma for 20 seconds (FIG. 3B).

FIG. 3A shows the Ge gate profile after high-k removal by a pure $BCl_3$ plasma for 10 seconds and FIG. 3B shows the Ge gate profile after high-k removal by a BCl₃/N₂ (10% N₂) plasma for 20 seconds. No lateral attack of the Ge profile was seen in FIG. 3B.

The optimal plasma parameters used for the deposition of a BxNy passivation film during high-k removal in a Ge gate stacks as presented in example 2 was as follows:
Pressure 5 mT (within range 5 mT-80 mT),
plasma power 450 W (within range 100-1200 W),
substrate bias −30V,
BCl₃ 90 sccm (standard centimeter cube per minute),
N₂ 10 sccm.

Addition of small amounts of N₂ (in the presented case 10% N₂ was added) to the BCl₃ plasma during high-k removal, besides affording an increase in etch selectivity of HfO₂ over silicon by a factor 7, additionally preserved the shape of the Ge gate. This was due to the deposition of a BxNy-like passivation film on the gate (vertical) sidewalls. The BxNy-like passivation film was a sacrificial layer which was removed afterwards by wet treatment.

Example 2

Characterization of the Deposited BxNy Layer

A plasma composition (BCl₃/N₂) and method as described above was used to deposit a BxNy layer. The BxNy film was characterized by Fourier Transmission Infra-Red spectrometry (FTIR) and X-ray Photoelectron Spectroscopy (XPS). It was found that a plasma mixture of BCl₃ and N₂ resulted in the deposition of a BxNy film onto a (flat) wafer surface if no bias was applied to the substrate (to avoid ion bombardment). The BxNy film was deposited in an etch chamber (LAM Versys 2300) at 60° C. and 275° C. at a rate as high as 300 nm/min depending on the pressure, plasma power, gas flows and BCl₃ to N₂ ratio.

Figure 4:
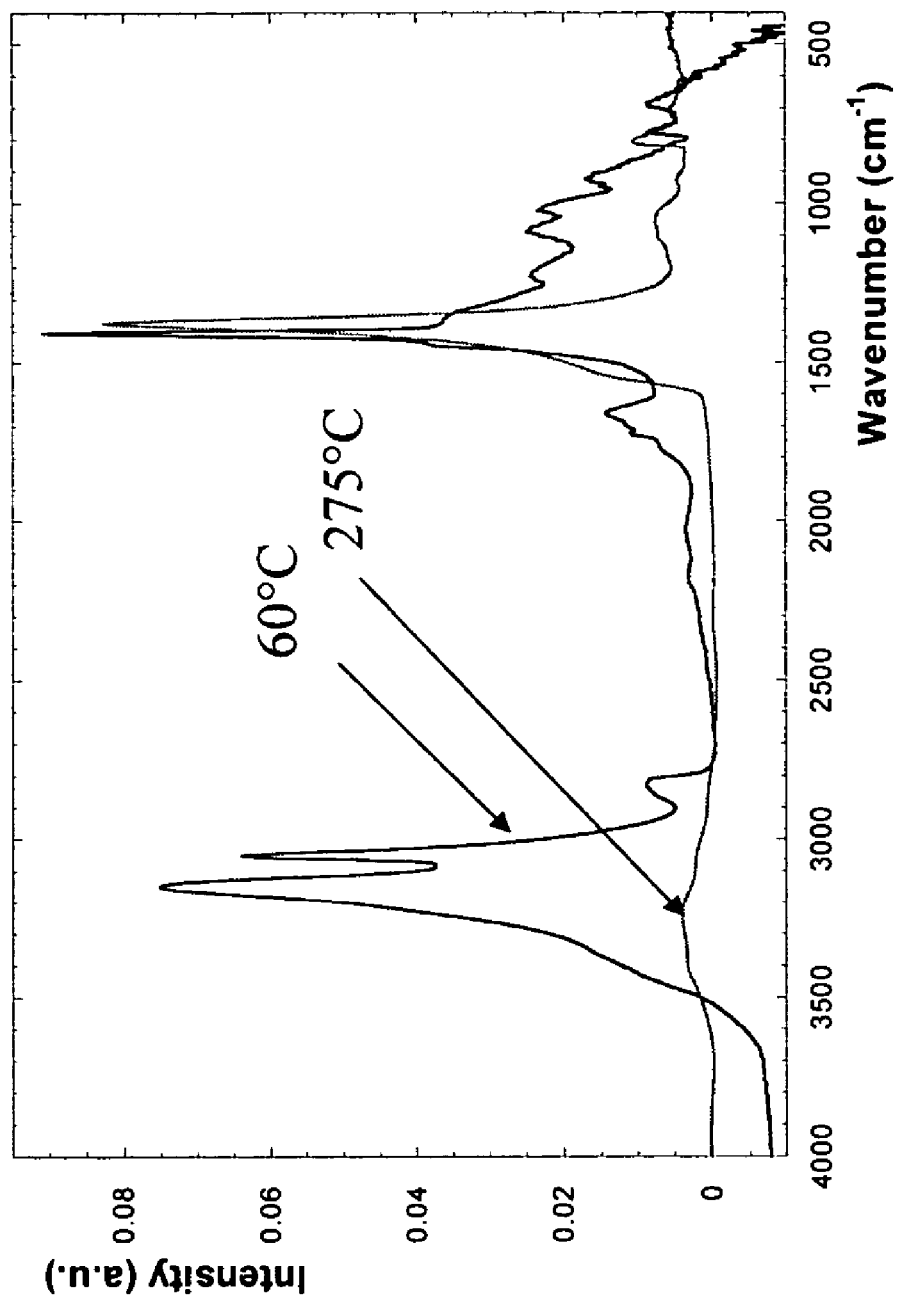
FIG. 4 shows FTIR (Fourier Transform Infrared Spectroscopy) spectra of films deposited from $BCl_3/N2$ plasma mixture (70% $BCl_3$) at 275° C. and 60° C.

The FTIR spectra of the BxNy films deposited at 60° C. and 275° C. (for comparison) are shown in FIG. 4. A strong peak at about 1400 cm$^{-1}$ is attributed to a hexagonal boron nitride (h-BN). This peak dominated the spectrum of the film deposited at 275° C. but the spectrum of the film deposited at 60° C. contained a number of other peaks and, therefore, that film was not pure BN.

The XPS analysis of the surface of the film deposited at 60° C. showed primarily boron (about 36%), nitrogen (about 20%) and oxygen (about 36%). Some carbon (about 7%) is attributed to the contamination from the atmosphere. The amount of chlorine did not exceed 1%. As the deposition plasma contained no O₂, the significant amount of oxygen in the film is a sign of the film oxidation during the atmosphere exposure.

The deposited BxNy-like film was found to be easily decomposed by temperature (the film thickness decreases at temperatures above 100° C.) and soluble in water at room temperatures. These properties make cleaning of any deposited inhibitor layer easy: the water rinse is enough to clean any BxNy-like film that is left after the etching.

By mixing BCl₃ and N₂ in a plasma etch chamber it is possible to deposit a BxNy-like film that contains almost no Cl₂. The film is relatively unstable and can be easily removed during etching by means of ion bombardment, or after etching by a water rinse as it is soluble in water.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description provides several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method for etching a second material selectively over a first material, the method comprising the steps of:
    dry etching using a plasma, wherein during dry etching a protective and water-soluble film is deposited onto a first material such that an etch rate of the first material is dropped to almost zero, and whereby almost no protective and water-soluble film is deposited onto a second material; and
    removing the protective and water-soluble film from the first material.

2. The method of claim 1, wherein the plasma comprises a boron-halogen compound and nitrogen, and wherein a ratio of the boron-halogen compound to nitrogen is from 19:1 to 5.6:1.

3. The method of claim 1 wherein the boron-halogen compound is BCl₃.

4. The method of claim 3, wherein a ratio of BCl₃ to nitrogen in the plasma is from 9:1 to 6.7:1.

5. The method of claim 3, wherein the second material is a high-k material.

6. The method of claim 1 wherein the protective and water-soluble film is a BxNy comprising film.

7. The method of claim 1, wherein the second material is HfO₂.

8. The method of claim 1, wherein the first material is silicon, and wherein a ratio of the boron-halogen compound to nitrogen is 9:1.

9. The method of claim 8, wherein the silicon is undoped polycrystalline silicon or doped or polycrystalline silicon.

10. The method of claim 1 wherein the first material is silicon dioxide, and wherein a ratio of the boron-halogen compound to nitrogen is from 9:1 to 6.7:1.

11. The method of claim 1, wherein the protective and water-soluble layer is removed during etching using the plasma by ion bombardment.

12. The method of claim 11, whereby ion bombardment is conducted by using a substrate bias during plasma etching which is different from zero.

13. The method of claim 12, wherein the substrate bias during plasma etching is from −30 v to −60V.

14. The method of claim 1, wherein the protective and water-soluble layer is removed after etching by a wet rinse.

15. The method of claim 1, wherein a plasma power is from 100 W to 1200 W.

16. The method of claim 1, wherein a plasma power is about 450 W.

17. The method of claim 1, wherein a pressure in the plasma is from 5 mT to 80 mT.

18. The method of claim 1, wherein a pressure in the plasma is 5 mT.

* * * * *

UNITED STATES PATENT AND TRADEMARK OFFICE
CERTIFICATE OF CORRECTION

PATENT NO.        : 7,598,184 B2                              Page 1 of 1
APPLICATION NO.   : 11/585564
DATED             : October 6, 2009
INVENTOR(S)       : Shamiryan et al.

It is certified that error appears in the above-identified patent and that said Letters Patent is hereby corrected as shown below:

| Issued Patent | | 1. Description of Error |
|---|---|---|
| Column | Line | |
| 7 | 49 | Change "BC13" to --$BCl_3$--. |
| 11 | 2 | In Claim 13, change "–30 v" to -- –30 V--. |

Signed and Sealed this
Sixth Day of December, 2011

David J. Kappos
*Director of the United States Patent and Trademark Office*